United States Patent
Li et al.

(10) Patent No.: US 10,424,655 B2
(45) Date of Patent: Sep. 24, 2019

(54) DUAL GATE LDMOS AND A PROCESS OF FORMING THEREOF

(71) Applicant: GLOBALFOUNDRIES Singapore Pte. Ltd., Singapore (SG)

(72) Inventors: Ming Li, Singapore (SG); Jeoung Mo Koo, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/842,899

(22) Filed: Dec. 15, 2017

(65) Prior Publication Data

US 2019/0189779 A1    Jun. 20, 2019

(51) Int. Cl.
*H01L 29/66* (2006.01)
*H01L 29/10* (2006.01)
(Continued)

(52) U.S. Cl.
CPC .. *H01L 29/66681* (2013.01); *H01L 21/02238* (2013.01); *H01L 21/26513* (2013.01);
(Continued)

(58) Field of Classification Search
CPC . H01L 2224/48227; H01L 2224/73265; H01L 2224/0401; H01L 2924/00; H01L 2224/32225; H01L 2924/00014; H01L 2924/00012; H01L 2224/32145; H01L 2224/48091; H01L 2924/00011; H01L 2924/14; H01L 2924/15311; H01L 2924/3011; H01L 21/76224; H01L 2225/1023; H01L 2225/1058; H01L 24/73; H01L 25/0652; H01L 25/105; H01L 25/18; H01L 33/62; H01L 2023/405; H01L 2023/4081; H01L 21/0217; H01L 21/265; H01L 21/26586; H01L 21/266;
(Continued)

(56) References Cited

U.S. PATENT DOCUMENTS

| | | | |
|---|---|---|---|
| 2010/0213544 A1* | 8/2010 | Liu | H01L 27/0922 257/339 |
| 2014/0131796 A1* | 5/2014 | Zhou | H01L 29/66681 257/336 |

OTHER PUBLICATIONS

Santosh Sharma et al., Planar Dual Gate Oxide LDMOS Structures in 190nm Power Management Technology, Proceedings of the 2012 24th International Symposium on Power Semiconductor Devices and ICs, 2012, pp. 405-408, IEEE.

* cited by examiner

*Primary Examiner* — Robert G Bachner
(74) *Attorney, Agent, or Firm* — Thompson Hine LLP

(57) ABSTRACT

A method for forming a high voltage device is disclosed. The method comprises providing a substrate defined with a high voltage device region. A device well is formed to encompass the high voltage device region. A drift region is formed within the device well. A body well is formed within the device well adjacent to the drift region. A variable thickness gate dielectric is formed on the substrate. Forming the variable thickness gate dielectric comprises patterned a sacrificial polysilicon layer and oxidizing the patterned sacrificial polysilicon layer to define a thick gate oxide having sloped sidewalls. A gate electrode is formed on the variable thickness gate dielectric, wherein the gate electrode partially overlaps the thick gate oxide. A first and a second source/drain (S/D) region is formed adjacent to first and second sides of the variable thickness gate dielectric.

20 Claims, 13 Drawing Sheets

(51) Int. Cl.
  *H01L 29/423*   (2006.01)
  *H01L 29/49*    (2006.01)
  *H01L 29/08*    (2006.01)
  *H01L 21/265*   (2006.01)
  *H01L 21/02*    (2006.01)
  *H01L 29/78*    (2006.01)
  *H01L 29/06*    (2006.01)
  *H01L 21/28*    (2006.01)
  *H01L 29/36*    (2006.01)
  *H01L 21/762*   (2006.01)
  *H01L 21/66*    (2006.01)
  *H01L 29/40*    (2006.01)
  *H01L 27/092*   (2006.01)
  *H01L 21/3105*  (2006.01)
  *H01L 21/266*   (2006.01)
  *H01L 21/3213*  (2006.01)

(52) U.S. Cl.
  CPC .. *H01L 21/28035* (2013.01); *H01L 21/76224* (2013.01); *H01L 29/0649* (2013.01); *H01L 29/0865* (2013.01); *H01L 29/0882* (2013.01); *H01L 29/1095* (2013.01); *H01L 29/36* (2013.01); *H01L 29/42368* (2013.01); *H01L 29/42376* (2013.01); *H01L 29/4916* (2013.01); *H01L 29/7816* (2013.01); *H01L 21/266* (2013.01); *H01L 21/31053* (2013.01); *H01L 21/32137* (2013.01); *H01L 22/26* (2013.01); *H01L 27/092* (2013.01); *H01L 29/063* (2013.01); *H01L 29/402* (2013.01)

(58) Field of Classification Search
  CPC ................. H01L 21/283; H01L 21/285; H01L 21/31116; H01L 21/31144; H01L 21/32051; H01L 21/3212; H01L 21/324; H01L 21/565; H01L 21/6835; H01L 21/76802; H01L 21/76834; H01L 21/76877; H01L 21/78; H01L 21/823462; H01L 21/823481; H01L 21/823814; H01L 21/823864; H01L 2224/0345; H01L 2224/03462; H01L 2224/04042; H01L 2224/05124; H01L 2224/05147; H01L 2224/11334; H01L 2224/13024; H01L 2224/16225; H01L 2224/211; H01L 2224/24145; H01L 2224/32245; H01L 2224/48106; H01L 2224/48225; H01L 2224/73209; H01L 2224/73253; H01L 2224/73267; H01L 2225/0651; H01L 2225/0652; H01L 2225/06527; H01L 2225/06541; H01L 2225/06558; H01L 2225/06562; H01L 2225/06572; H01L 2225/06586; H01L 2225/06589; H01L 23/3114; H01L 23/3672; H01L 23/3675; H01L 23/4093; H01L 23/481; H01L 23/5226; H01L 23/5228; H01L 23/53228; H01L 23/60; H01L 24/03; H01L 24/05; H01L 24/11; H01L 24/14; H01L 24/16; H01L 24/19; H01L 24/24; H01L 24/32; H01L 24/48; H01L 24/82; H01L 24/97; H01L 25/0657; H01L 25/50; H01L 27/0805; H01L 27/0928; H01L 28/24; H01L 28/40; H01L 2924/01019; H01L 2924/01055; H01L 2924/1431; H01L 2924/1432; H01L 2924/1434; H01L 2924/15321; H01L 2924/15331; H01L 29/0847; H01L 29/1095; H01L 29/402; H01L 29/665; H01L 29/66545; H01L 29/66553; H01L 29/66659; H01L 29/66681; H01L 29/66689; H01L 29/66742; H01L 29/7824; H01L 29/7835; H01L 29/7843; H01L 31/0521; H01L 31/0547; H01L 31/0549; H01L 33/06; H01L 33/22; H01L 33/30; H01L 33/32; H01L 33/36; H01L 51/0096; H01L 51/5268
  See application file for complete search history.

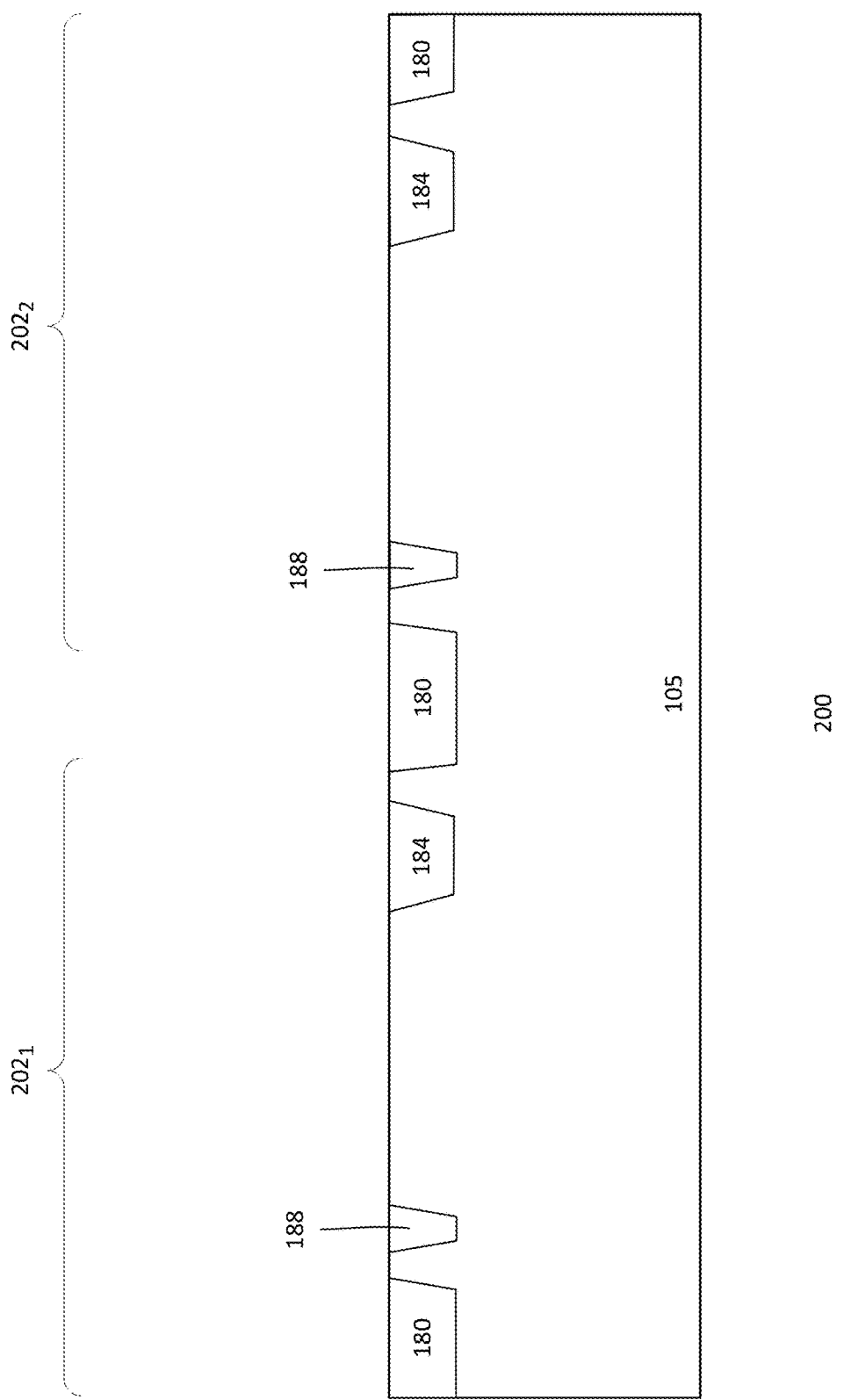

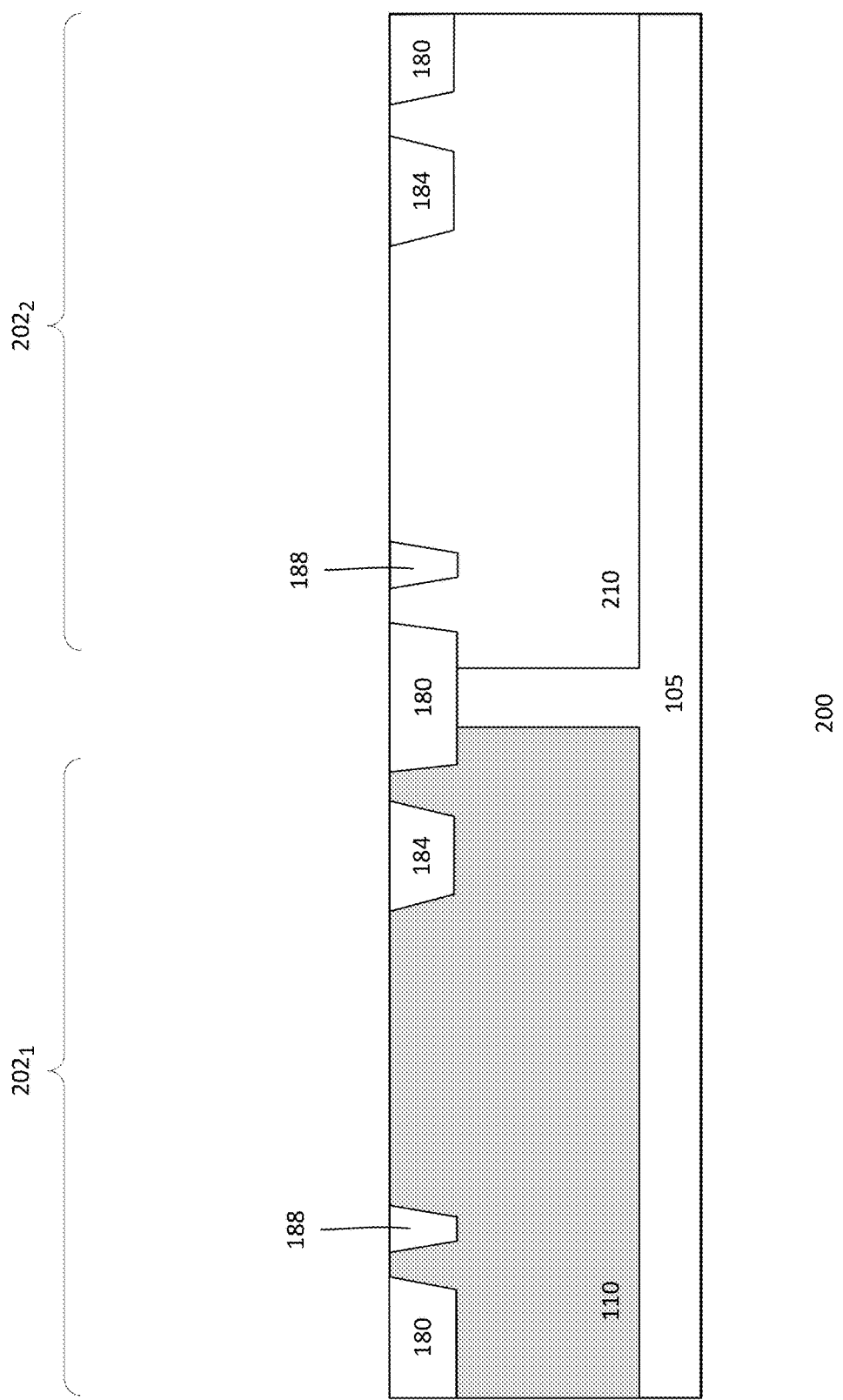

DUAL GATE LDMOS AND A PROCESS OF FORMING THEREOF

BACKGROUND

High voltage devices, such as high voltage field-effect transistors, having high breakdown voltage and low on-state resistance are used in integrated circuits (ICs) for high voltage applications. Such high voltage field-effect transistors include lateral double-diffused metal oxide semiconductor (LDMOS) transistors. In some high voltage applications, an integrated circuit may include multiple LDMOS transistors connected in parallel to allow higher current handling capabilities. This requires individual LDMOS transistors to be uniformly formed so as to ensure even distribution of current among each of the transistors. However, conventional processes for forming LDMOS transistors are difficult to control and unreliable in forming uniform LDMOS transistor gates.

Moreover, the performance of an LDMOS transistor generally depends on the drain-to-source on-resistance ($R_{dson}$) as well as breakdown voltage (Vbr). For high performance LDMOS transistors, low drain-to-source on-resistance ($Rds_{on}$) is desired to minimize its power dissipation when it is turned on, as well as high Vbr to maximize its voltage capability. For example, lower $R_{dson}$ results in higher switching speeds while higher Vbr increases device reliability. Generally, higher breakdown voltage may be achieved by increasing the drain-to-gate surface area on the substrate. This however increases gate-to-drain capacitance, resulting in a larger $R_{dson}$. Thus, there is often a trade-off between $R_{dson}$ and Vbr during performance optimizations.

Accordingly, there is a need to provide improved high voltage devices that have lower $R_{dson}$ as well as higher Vbr. In addition, there is also a desire to provide precise and reliable methods to form these high voltage devices.

SUMMARY

Embodiments generally relate to semiconductor devices and methods for forming a semiconductor device. In one embodiment, a method for forming a high voltage semiconductor device is disclosed. The method includes providing a substrate and forming a plurality of isolation regions within the substrate. The isolation regions comprise a device isolation region surrounding a first and a second internal isolation region. The device isolation region defines a high voltage (HV) device region of the substrate. The first and second internal isolation regions are disposed in the HV device region. A device well is formed in the HV device region. The device well encompasses the HV device region. A drift region is formed within the device well. The drift region is positioned adjacent to the first internal isolation region and partially underlaps the first internal isolation region. A body well is formed within the device well. The body well is positioned adjacent to the drift region and surrounds the second internal isolation region. A dual gate structure is formed on the substrate between the first and second internal isolation regions. The dual gate structure comprises oxidized polysilicon material. A first and a second source/drain (S/D) region are formed adjacent to first and second sides of the dual gate structure. The first S/D region is disposed within the body well and the second S/D region is disposed in the drift region.

In another embodiment, the method comprises providing a substrate defined with a high voltage device region. A device well is formed to encompass the high voltage device region. A drift region is formed within the device well. A body well is formed within the device well adjacent to the drift region. A variable thickness gate dielectric is formed on the substrate. Forming the variable thickness gate dielectric comprises patterned a sacrificial polysilicon layer and oxidizing the patterned sacrificial polysilicon layer to define a thick gate oxide having sloped sidewalls. A gate electrode is formed on the variable thickness gate dielectric, wherein the gate electrode partially overlaps the thick gate oxide. A first and a second source/drain (S/D) region is formed adjacent to first and second sides of the variable thickness gate dielectric. The first S/D region is disposed within the drift region and the second S/D region is disposed in the body well of the HV device region.

In yet another embodiment, a semiconductor device is disclosed. The semiconductor device includes a substrate and a device isolation region disposed in the substrate. The device isolation region defines a high voltage (HV) device region. A first and a second well are disposed in HV device region. The first well encompasses the HV device region and the second well is disposed within the first well. A drift region is disposed within the first well adjacent to the second well. A dual gate structure is disposed on the substrate overlapping the second well and the drift region. The dual gate structure comprises a gate electrode and a variable thickness gate dielectric. The variable thickness gate dielectric comprises oxidized polysilicon material. A first and a second source/drain (S/D) region are disposed adjacent to the first and second sides of the dual gate structure.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 2a-2l show cross-sectional views of an embodiment of a process for forming a device.

DETAILED DESCRIPTION

Embodiments generally relate to semiconductor devices or integrated circuits (ICs). More particularly, embodiments relate to high voltage (HV) devices. For example, the HV devices include HV transistors. The HV transistors, for example, include lateral double-diffused metal oxide semiconductor (LDMOS) transistors. As an illustration, the HV devices of the present disclosure can be employed as switching voltage regulators for power management applications. The HV devices may also be employed in other suitable applications. The HV transistors can be easily integrated into devices or ICs. The devices or ICs can be incorporated into or used with, for example, consumer electronic products, and particularly portable consumer products such as smart phones, mobile phones, tablets, TV displays and personal digital assistants (PDA).

Figure 1:
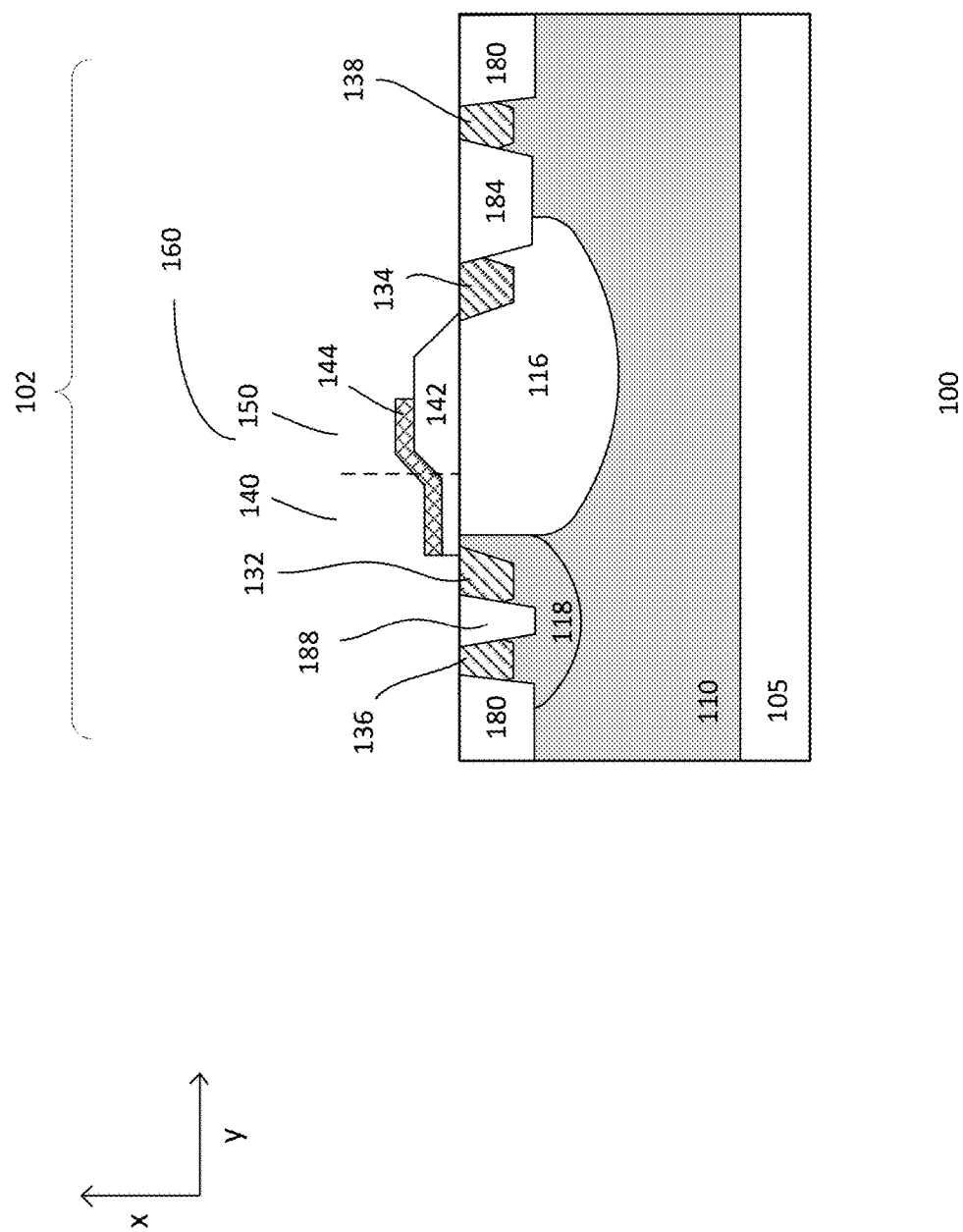
FIG. 1 shows a cross-sectional view of an embodiment of a device.

FIG. 1 shows a cross-sectional view of a portion of an embodiment of a device 100. The device is, for example, an IC. Other types of devices may also be useful. The device includes a substrate 105. The substrate, for example, is a silicon substrate. Other types of substrates, such as silicon germanium, germanium, gallium arsenide, or silicon-on-insulator (SOI) substrates, are also useful. The substrate may be a doped substrate. For example, the substrate may be lightly doped with second polarity type dopants, such as p-type or n-type dopants. Providing a substrate with other types of dopants or dopant concentrations as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p-type or n-type. A lightly doped region may have a dopant concentration of about 1E11-1E13 $cm^{-3}$. An intermediately doped region may have a dopant concentration from about 1E13-1E15 $cm^{-3}$. A heavily doped region may have a dopant concentration of about 1E15-1E17 $cm^{-3}$. Other suitable concentrations of the different doped regions may also be useful. P-type dopants may include boron (B), fluorine (F), aluminum (Al), indium (In) or a combination thereof, while n-type dopants may include phosphorous (P), arsenic (As), antimony (Sb) or a combination thereof.

The substrate includes a peripheral circuit region. In one embodiment, the peripheral circuit region includes one or more high voltage (HV) device region 102. It is understood that the substrate 105 may also include other device regions for other types of circuitry. For example, the substrate may also include device regions for intermediate voltage (IV) and low voltage (LV) devices as well as an array region for a plurality of interconnected memory devices, such as NVM devices.

In one embodiment, a device isolation region 180 surrounds the HV device region 102. The device isolation region 180, for example, isolates the HV device region 102 from other device regions. The device isolation region is, in one embodiment, a shallow trench isolation (STI) region. Other types of isolation regions may also be employed. For example, providing a deep trench isolation (DTI) region may also be useful. The STI regions, for example, extend to a depth of about 2000-5000 Å from the top surface of the substrate. In the case of DTI regions, the depth may be about 1-10 μm. Providing isolation regions having other depth dimensions may also be useful depending on isolation requirements.

The HV device region 102 includes first and second internal isolation regions 184 and 188. In one embodiment, the internal isolation regions are the same type of isolation region as the device isolation region 180. The internal isolation regions are, for example, STI regions. Other types of internal isolation regions 184 and 188 may also be useful. The internal isolation regions 184 and 188 extend along a channel length direction (y-axis) to define a width of each internal isolation region. In one embodiment, the first and second internal isolation regions 184 and 188 are configured with different widths. For example, the first internal isolation region 184 includes a larger width compared to the second internal isolation region 188. The internal isolation regions serve to provide electrical isolation between different transistor contact regions. Transistor contact regions, for example, include source/drain (S/D) regions and well tap regions, which will be described in detail later. The dimensions of the internal isolation regions may depend on isolation requirements.

The HV device region 102 includes a HV transistor, such as a LDMOS transistor. In one embodiment, the HV transistor includes a dual gate structure 160 disposed on the top surface of the substrate. The dual gate structure 160, for example, includes a gate electrode 144 partially overlapping a variable thickness gate dielectric 142 (hereinafter, "dual gate dielectric"). The gate electrode may be a polysilicon gate electrode. Other types of gate electrode materials may also be used. For example, the gate electrode may include metal material, such as tantalum nitride (TaN) or titanium nitride (TiN). As for the dual gate dielectric 142, it can be silicon oxide or oxidized polysilicon.

As shown, the dual gate structure 160 is disposed between the first and second internal isolation regions 184 and 188. The dual gate dielectric 142 includes an asymmetrical structure defined by a thin gate dielectric and a thick gate dielectric. In one embodiment, the thin gate dielectric includes a planar top surface and a vertical sidewall while the thick gate dielectric includes a planar top surface and tapered (or sloped) sidewalls. The thin gate dielectric, for example, abuts a tapered sidewall of the thick gate dielectric to form a continuous gate dielectric structure. The tapered sidewalls of the thick gate dielectric advantageously provides a gradual transition from the thinner gate dielectric to the thicker gate dielectric. Other suitable gate dielectric configurations allowing a gradual transition between different dielectric thicknesses may also be useful. The gate electrode 144 is conformally disposed over the dual gate dielectric 142 and includes a uniform thickness throughout.

In one embodiment, the gate electrode 144 is aligned to an outer edge of the dual gate dielectric 142 and extends laterally over the dual gate dielectric 142 to define a primary gate 140 and a secondary gate 150. For example, the portion of gate electrode overlapping the thin gate dielectric forms an active HV transistor gate 140 (hereinafter "transistor gate") and the portion of gate electrode overlapping the thick gate dielectric forms a gate field plate 150. The gate electrode 144 extends continuously from the vertical sidewall of the thin gate dielectric to partially overlap the planar top surface of the thick gate dielectric. For example, the transistor gate 140 is electrically and physically connected to the gate field plate 150. The gate field plate 150 includes a slanted portion disposed on the tapered sidewall of the thick gate dielectric and a horizontal portion disposed on the planar top surface of the thick gate dielectric.

In one embodiment, first and second diffusion regions 132 and 134 are disposed in the substrate adjacent to first and second sides of the dual gate structure 160. For example, the first diffusion region 132 is disposed adjacent to the thin gate dielectric and the second diffusion region 134 is disposed adjacent to the thick gate dielectric. The diffusion regions, in one embodiment, are heavily doped with first polarity type dopants for a first polarity type transistor. The polarity type defines the type of the transistor. For example, the first polarity type may be n-type for a n-type transistor or p-type for a p-type transistor. The diffusion regions 132 and 134 have a depth shallower than the internal isolation regions 184 and 188.

In one embodiment, the first and second diffusion regions may serve as source and drain (S/D) regions of the transistor. For example, the first diffusion region 132 may serve as the source region and the second diffusion region 134 may serve as the drain region. Other configurations of S/D regions may also be useful. In one embodiment, the source region 132 is aligned to the second internal isolation region 188 and slightly underlaps the thin gate dielectric portion. For example, the source region 132 is in communication with a transistor channel region located under the transistor gate 140. As for the drain region 134, it is aligned to the first internal isolation region 184 and slightly underlaps the tapered outer sidewall of the thick gate dielectric portion. As shown, the drain region is displaced a distance from the gate field plate 150. Displacing the drain region 134 from the gate field plate 150 reduces peak electric field near the transistor channel region for HV breakdown operation.

A device well 110 may be provided in the substrate 105. In one embodiment, the device well 110 encompasses the HV device region 102 and underlaps a portion of the device isolation regions 180. The device well is, in one embodiment, a lightly doped well. The dopant concentration of the device well 110 is, for example, about 1E12-1E13 cm$^{-3}$. In one embodiment, the device well 110 is doped with second polarity type dopants for a first polarity type transistor. For example, the device well 110 includes p-type dopants for a n-type transistor, or n-type dopants for a p-type transistor. The device well 110 is formed with sufficient depth and width to provide electrical isolation between the HV device region 102 and adjacent active regions of the substrate.

A doped drift region 116 is disposed in the HV device region 102. For example, the drift region is disposed within the device well 110. As shown, the drift region 116 encompasses the drain region 134 and underlaps a portion of the dual gate structure 160. For example, the device well extends laterally beyond the thick gate dielectric to partially underlap the thin gate dielectric. The drift region 116 connects the drain region 134 to the transistor channel region under the transistor gate 140. The distance from the drain region 134 to the inner edge of the drift region 116 underlapping the transistor gate 140 may be defined by the desired $R_{dson}$.

In one embodiment, the drift region 116 is doped with first polarity type dopants for a first polarity type transistor. For example, the device well may include n-type dopants for a n-type transistor or p-type dopants for a p-type transistor. The drift region may be lightly or intermediately doped. In one embodiment, the drift region 116 includes a higher dopant concentration relative to the device well 110. The dopant concentration of the drift region 116 is, for example, about 5E12-5E13 cm$^{-3}$. Other dopant concentrations may also be useful depending on the maximum Vbr requirement of the HV transistor. In one embodiment, the drift region 116 includes a depth deeper than the internal isolation regions 184 and 188. For example, the device well extends below and underlaps a portion of the first internal isolation region 184.

A body well 118 is disposed in the HV device region 102. For example, the body well is disposed within the device well 110 and adjacent to the drift region 116. The body well 118 includes second polarity type dopants for a first polarity type transistor. For example, the body well 118 includes p-type dopants for a n-type transistor or n-type dopants for a p-type transistor. The dopant concentration of the body well may be lower than the dopant concentration of the source and drain regions 132 and 134. In one embodiment, the body well 118 is lightly or intermediately doped with p-type dopants for a n-type transistor. For example, the dopant concentration of the body well may be about 5E12-5E13 cm$^{-3}$. Other dopant concentrations may also be useful. The dopant concentration should be sufficient to provide the desired threshold voltage ($V_{th}$) for the HV transistor while preventing punch-through current.

The body 118 includes a depth deeper than the internal isolation regions. In one embodiment, the body well 118 encompasses the second internal isolation region 188 and the source region 132, and extends laterally beyond the second internal isolation region 188 to underlap a portion of the device isolation region 180. In one embodiment, the body well 118 may extend along the channel length direction (y-axis) to underlap a portion of the transistor gate 140. The body well 118 may be contiguous with the inner edge of the drift region 116. Although the depth of the body well 118 is illustrated as shallower than the depth of the drift region 116, it is to be understood that the depth of the body well may also be the same as or deeper than the drift region 116. In one embodiment, the overlap portion between the transistor gate 140 and the body well 118 determines a length of the transistor channel region. For example, the transistor channel length is about equal to the distance between the source region 132 and the drift region 116.

Well taps may be provided in the substrate 105 within the device region 102. For example, a first well tap 136 is disposed within the body well 118 and a second well tap 138 is disposed within the device well 110. The first and second well taps are doped with second polarity type dopants for a first type transistor. The second polarity type may be p-type or n-type. A well tap, in one embodiment, is a heavily doped region. A well tap, for example, has a dopant concentration of about 1E15-1E17 cm$^{-3}$. In one embodiment, the well taps may be formed by the same process parameters as the S/D regions. For example, the dopant concentration and depth of the well taps 136 and 138 may be the same or similar to the transistor S/D regions 132 and 134. Providing well taps having different depths and dopant concentrations from the S/D regions may also be useful. The well taps serve to reduce contact resistance and facilitate biasing of the body well 118 and device well 110. The first well tap 136 may be referred to as the body well contact and the second well tap 138 may be referred to as the device well contact.

In one embodiment, the body well contact 136 is aligned to the second internal isolation region 188 and device isolation region 180. For example, the second internal isolation region 188 isolates the body well contact 136 from the source region 132. This arrangement allows the body well 118 to be biased independently from the source region 132, such that the body well tap biasing voltage may be different from the source voltage.

In one embodiment, the device well contact 138 is aligned to the first internal isolation region 184 and device isolation region 180. For example, the first internal isolation region 184 isolates the device well contact 138 from the drain region 134. This arrangement allows the device well 110 to be biased independently from the drain region, such that the device well contact biasing voltage may be different from the drain voltage.

Metal silicide contacts (not shown) may be provided on contact regions of the device 100. For example, the metal silicide contacts may be disposed on the S/D regions 132 and 134, well taps 136 and 138, and gate electrode 144. The metal silicide contacts, for example, may be nickel or nickel-based metal silicide contacts. Other suitable types of metal silicide contacts, including cobalt or cobalt-based metal silicide contacts may also be useful. The metal silicide contacts may be employed to reduce contact resistance and facilitate contact to the back-end-of-line (BEOL) metal interconnects.

A BEOL dielectric stack (not shown) may be disposed over the substrate. The BEOL dielectric stack, for example, includes inter-level dielectric (ILD) layers. It is understood that there may be additional layers between ILD layers, such as an etch stop layer. The ILD layers may include intra-metal dielectric (IMD) layers over a pre-metal dielectric (PMD) layer. The IMD layers may serve as metal levels in which metal interconnects are formed, or as contact levels in which contact plugs are formed to connect a lower metal level to an upper metal level. The metal interconnects, for example, provide connections between different device regions. A PMD layer may be disposed between the IMD layers and the substrate to connect front-end-of-line (FEOL) components to BEOL interconnects. For example, the PMD layer is the first contact level or CA level. The ILD layers may be, for example, silicon oxide. Other types of dielectric materials may also be used to form ILD layers. Contact plugs or via plugs, such as tungsten plugs, may be disposed in the contact levels. The contact plugs of the PMD layer are in communication with the terminals or contact regions of the HV transistor.

The embodiment as described in FIG. 1 results in various advantages. As described, the dual gate structure 160 includes a uniform gate electrode layer 144 disposed on a variable thickness gate dielectric structure 142 to form a HV transistor gate 140 and a gate field plate 150. The dual gate structure 160 reduces electric field crowding at the drain-side polysilicon edge of the gate electrode 144 because the electric field is redistributed by the step potential change of the gate dielectric 142. Providing a tapered transition from the HV transistor gate 140 to the gate field plate 150 reduces electric field enhancement at the thin-to-thick gate dielectric transition and allows a more uniform lateral electric field profile which enhances the RESURF (Reduced Surface Field) effect of the dual gate structure 160. As a result, the gate dielectric Vbr is improved and a lower $R_{dson}$ is achieved. Furthermore, the dual gate dielectric 142 also allows a shorter drift length to be achieved and potentially shrinks the footprint of the device region. Moreover, forming the HV transistor gate 140 and gate field plate 150 from the same gate electrode layer allows the HV transistor gate 140 and the field plate 150 to be commonly biased at a suitable potential.

FIGS. 2a-2l show cross-sectional views of an embodiment of a process 200 for forming a semiconductor device. The semiconductor device is, for example, an IC. Other types of devices may also be useful. The device formed by process 200 is similar or the same as the device 100 shown in FIG. 1. In the interest of brevity, common elements and features having the same reference numerals may not be described or described in detail.

Referring to FIG. 2a, a substrate 105 is provided. The substrate can include a silicon substrate, such as lightly doped p-type or n-type substrate. Other types of substrates, including silicon germanium, germanium, gallium arsenide, or SOI, are also useful. Providing a substrate with other types of dopants or dopant concentrations as well as an undoped substrate, may also be useful.

As shown, the substrate 105 is prepared with a peripheral circuit region in which one or more HV transistors are formed. In one embodiment, the peripheral circuit region includes a first HV device region $202_1$ and a second HV device region $202_2$. A HV device region, for example, accommodates a HV transistor. In one embodiment, the first HV device region $202_1$ and the second HV device region $202_2$ are provided to accommodate complementary HV transistors. For example, the first HV device region accommodates a first polarity type transistor while the second HV device region accommodates a second polarity type transistor. The first and second polarity type transistors are complementary types, such as n-type and p-type. For example, the first HV device region $202_1$ accommodates an n-type HV transistor and the second device region $202_2$ accommodates a p-type HV transistor. Although only HV device regions are shown, it would be appreciated that the substrate may also include other regions (not shown) for other types of circuitry, depending on the type of device or IC. In addition, it is understood that the first and second HV device regions $202_1$ and $202_2$ need not be adjacent to each other.

The substrate is prepared with isolation regions to separate the different device regions or active substrate regions. Isolation regions may include, for example, device isolation regions 180 and internal isolation regions 188 and 184. Device isolation regions 180 surround the first and second HV device regions. The device isolation regions, for example, isolate each HV device region from other regions. In one embodiment, the process for forming the device isolation regions 180 may also form the first and second internal isolation regions 184 and 188 within each HV device region. For example, the different isolation regions may be formed simultaneously with the same depth from the top substrate surface. Alternatively, the different isolation regions may be formed in separate process steps. In such case, the different isolation regions may be formed with different depths from the top substrate surface. The isolation regions are, for example, STI regions. Other suitable types of isolation regions, such as DTI regions, may also be useful.

Various processes can be employed to form STI regions with configuration as shown and as described in FIG. 1. In one embodiment, the substrate 105 is patterned to form trenches corresponding to locations where the various isolation regions are to be formed. For example, the substrate can be etched using etch and mask techniques to form trenches which are then filled with dielectric materials such as silicon oxide. Chemical mechanical polishing (CMP) can be performed to remove excess oxide and provide a substantially planar top surface. Other processes or materials can also be used to form the STI. The isolation region may also be other types of isolation regions.

Referring to FIG. 2b, device wells 110 and 210 are formed in the substrate. The device wells serve to isolate the first and second HV device regions $202_1$ and $202_2$ from adjacent active device regions in the substrate. In one embodiment, first and second polarity type dopants are ion implanted into the substrate to form a first device well 110 and a second device well 210. The ion implantation process may include forming an implant mask (not shown) over the substrate. The implant mask is, for example, a patterned photoresist layer. In one embodiment, the photoresist layer is patterned by a lithographic mask to form an opening over the first HV device region $202_1$. The opening, for example, exposes the first HV region and corresponds to the opening for a first device well implant. Using the patterned photoresist as the first device well implant mask, the substrate is implanted deeply with second polarity type dopants to form a second polarity type device well 110. For example, p-type dopants, such as Boron (B), Aluminum (Al), Gallium (Ga), or a combination thereof, are implanted into the first HV device region $202_1$. Implanting other p-type dopants may also be useful. The first device well implant mask protects the second HV device region $202_2$ from receiving the first device well implant. The first device well implant mask may be removed by, for example, an ashing process after forming the first device well 110. Other suitable techniques for removing a soft mask layer may also be employed.

The process continues by forming a second device well implant mask (not shown) for forming the second device well 210. The second device well implant mask may be similarly formed as the first device well implant mask. For example, an implant mask, such as a patterned photoresist, is formed over the substrate to selectively expose the second HV device region $202_2$ to a second device well implant. Using the second device well implant mask, the substrate is ion implanted with first polarity type dopants to form a first polarity type device well 210. For example, n-type dopants, such as Phosphorus (P), Arsenic (As), Antimony (Sb), or a combination thereof, are implanted into the second HV device region $202_2$. Implanting other p-type dopants may also be useful. The second device well implant mask may be removed by, for example, an ashing process after forming the second device well 210. Other suitable techniques for removing a soft mask layer may also be employed.

In one embodiment, implantation process for forming the device wells 110 and 210 include the same implant parameters. The implant parameters, such as energy and dose, are tailored to produce device wells at the desired location and with the desired effect. By adjusting the energy and dose of the implants, the dopant concentration and depth of the device wells can be controlled. Other techniques for forming the device wells may also be useful.

It is appreciated that the first and second device well implant masks may also be formed to expose other active regions of the substrate that require the same polarity type dopants to be implanted with the same implant parameters, such as implant dosage and concentration. For example, a plurality of first and second type device wells may be formed to accommodate multiple complementary HV transistors.

Figure 2C:
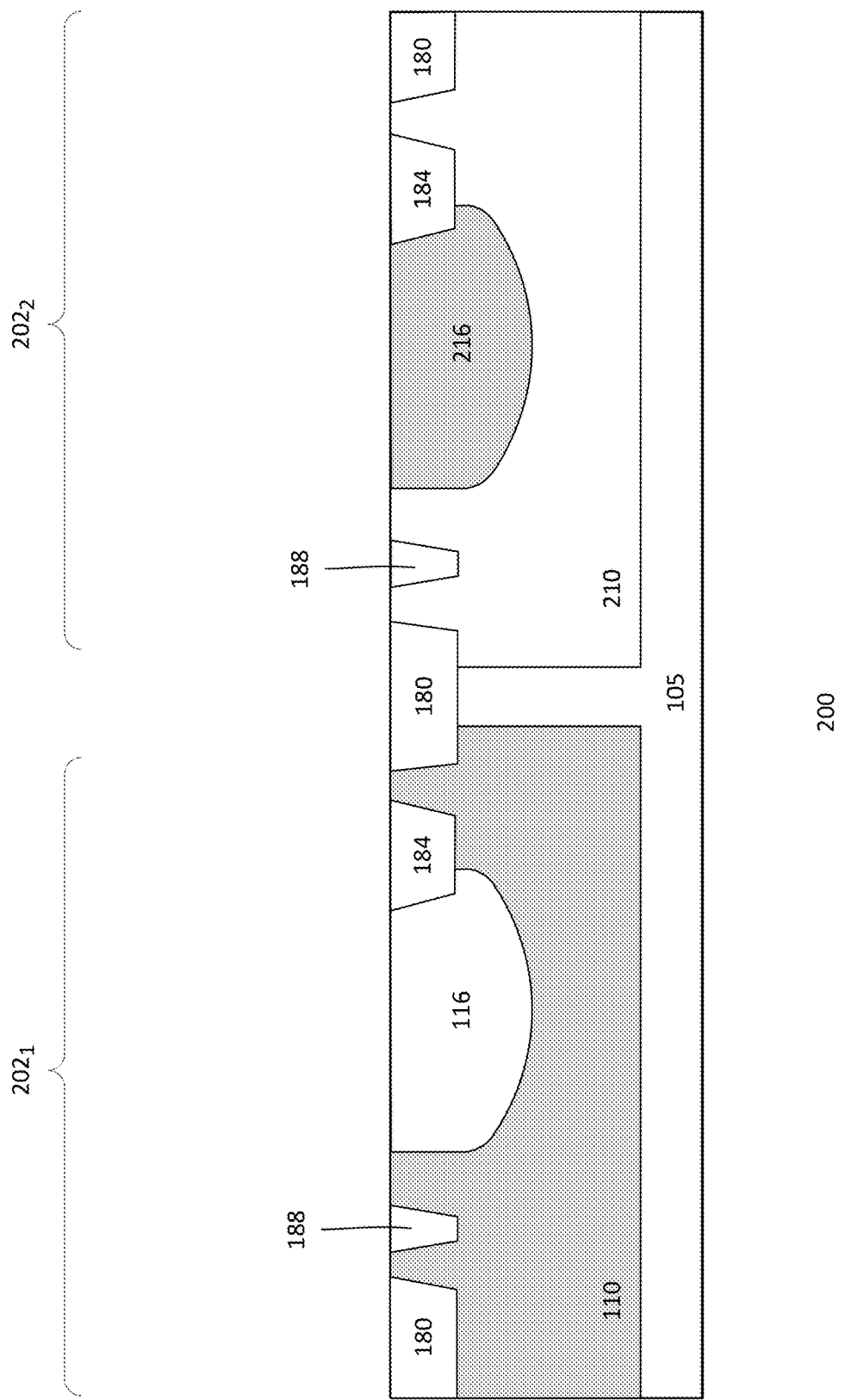

Referring to FIG. 2c, drift regions 116 and 216 are formed within each of the device wells 110 and 210 in the first and second HV device regions. In one embodiment, a n-type doped drift region 116 is formed for a p-type device well and a p-type doped drift region 216 is formed for a n-type device well. The drift regions, may be formed using similar implantation process as that employed for forming the device wells. The drift regions are, for example, formed by ion implantation. In one embodiment, the same implant parameters are used to form the drift regions 116 and 216. For example, the drift regions 116 and 216 are formed with about the same dopant concentration and depth. Other configurations of the drift regions may also be useful.

Figure 2D:
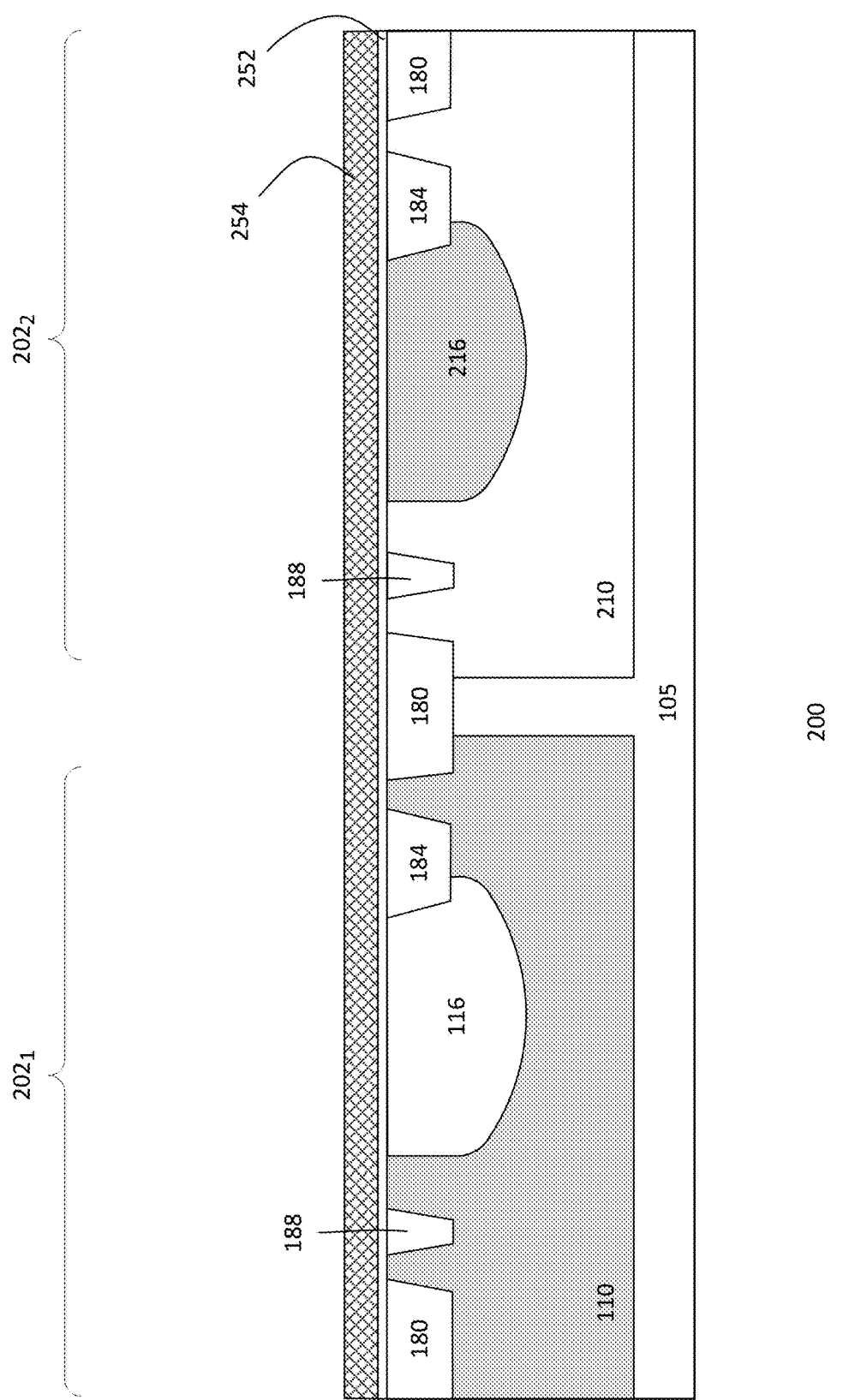

Referring to FIG. 2d, a pad dielectric layer 252 is formed on the substrate. In one embodiment, a thermal oxidation process is employed to form a pad dielectric layer 252. For example, the pad dielectric layer 252 may be a pad oxide layer formed by dry thermal oxidation process. The pad dielectric layer is, for example, high quality silicon oxide material. Other dielectric materials and process may also be used to form a high quality pad dielectric layer 252. The thermal oxidation process grows a thin pad oxide layer 252 on the top substrate surface in the first and second HV device regions. The thickness of the pad oxide layer may be about 50-100 Å. Other thicknesses may also be useful.

The process continues to form a polysilicon layer 254 on the pad oxide layer 252. The polysilicon layer is, for example, an undoped polysilicon layer. The thickness of the polysilicon layer may be about 1000-4000 Å. Various techniques, such as deposition processes, can be used to form the polysilicon layer 254. For example, polysilicon material can be deposited on the pad oxide layer 252 by chemical vapor deposition (CVD) to form the polysilicon layer. The polysilicon layer 254 may serve as sacrificial polysilicon to form the dual gate dielectric 142 shown in FIG. 1.

Figure 2E:
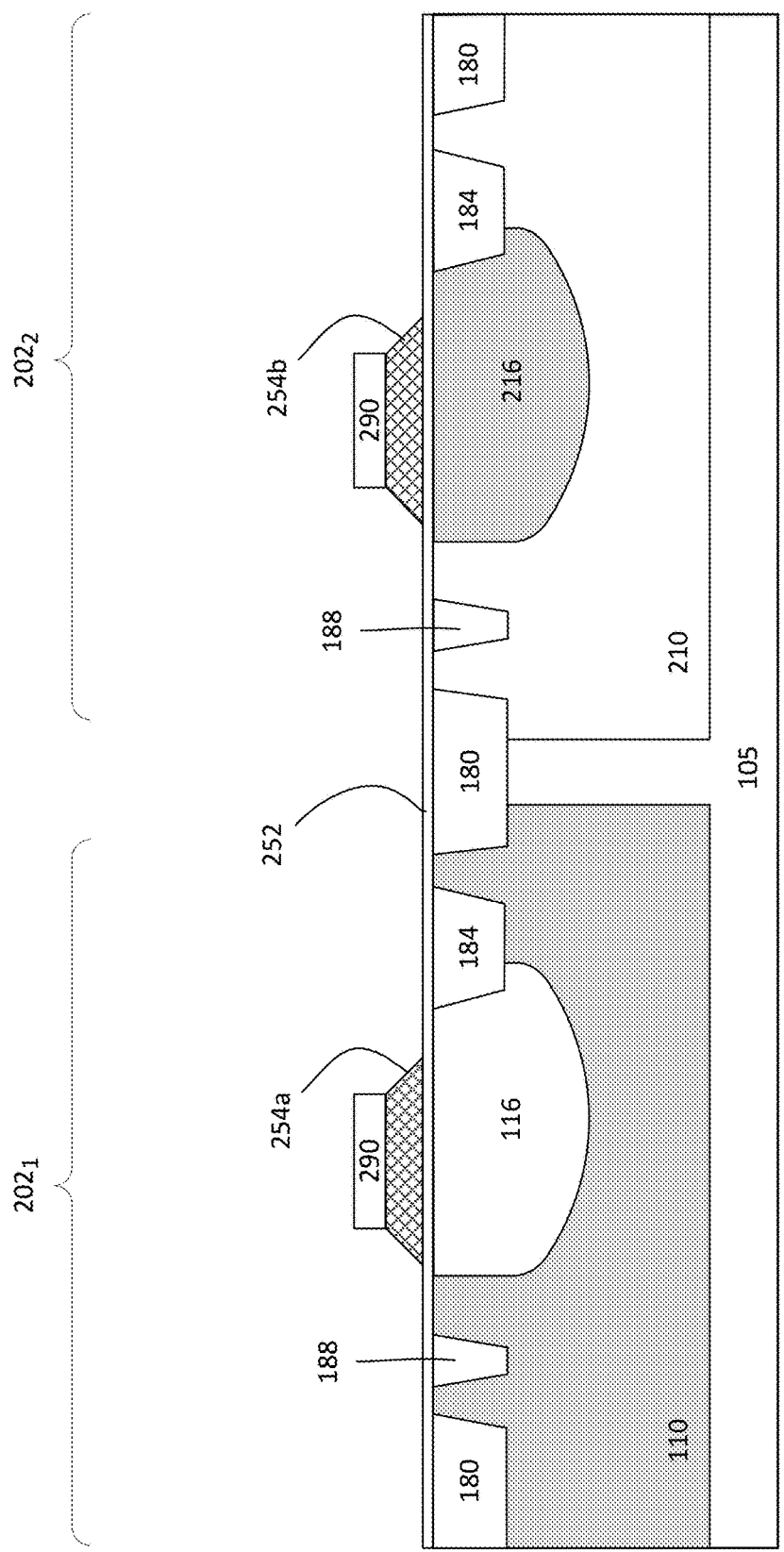

Referring to FIG. 2e, an etch mask 290 is formed over the sacrificial polysilicon layer 254. The etch mask 290 is, for example, a patterned photoresist. In one embodiment, the photoresist 290 is patterned as desired to expose portions of the polysilicon layer 254 to be removed. The photoresist 290 protects portions of the polysilicon layer 254 over the drift regions 116 and 216 in the first and second HV device regions $202_1$ and $202_2$ from an etch process. The protected portions of the polysilicon layer 254 correspond to locations where thick gate dielectric structures are to be formed. As such, the exposed portions of the polysilicon layer 254 over the substrate 105 are removed. In one embodiment, removal of the exposed polysilicon portions is achieved using a dry etch process, such as reactive ion etching (RIE). For example, a plasma etch process is performed. Other dry etch processes, including sputter etching and vapor phase etching may also be useful. In one embodiment, an oxygen plasma etch process is performed on the exposed portions of the polysilicon layer 254 to form polysilicon structures 254a and 254b having sloped sidewalls. The parameters of the oxygen plasma etch process may be adjusted such that a controlled addition of oxygen to the etch gas leads to controlled polymer deposition on the polysilicon layer 254, which influences the anisotropy of the etching process and forms polysilicon structures 254a and 254b having sloped sidewalls. For example, the polysilicon structures 254a and 254b include a sidewall angle of about 45 degrees (45°) relative to the pad oxide layer 252. Providing polysilicon structures with other sidewall angles may also be useful. In one embodiment, the pad oxide layer 252 serves as an etch stop layer of the dry etch process. For example, the oxygen plasma etch process is performed with end-point detection to improve etching precision. The end-point detection method may include measuring the optical spectrum of the etch gas to monitor the etching and detect changes in the etched material. Other end-point detection methods may also be employed.

The etch mask may be removed by, for example, an ashing process after forming the polysilicon structures 254a and 254b. Other suitable techniques for removing the etch mask 290 may also be employed.

Figure 2F:
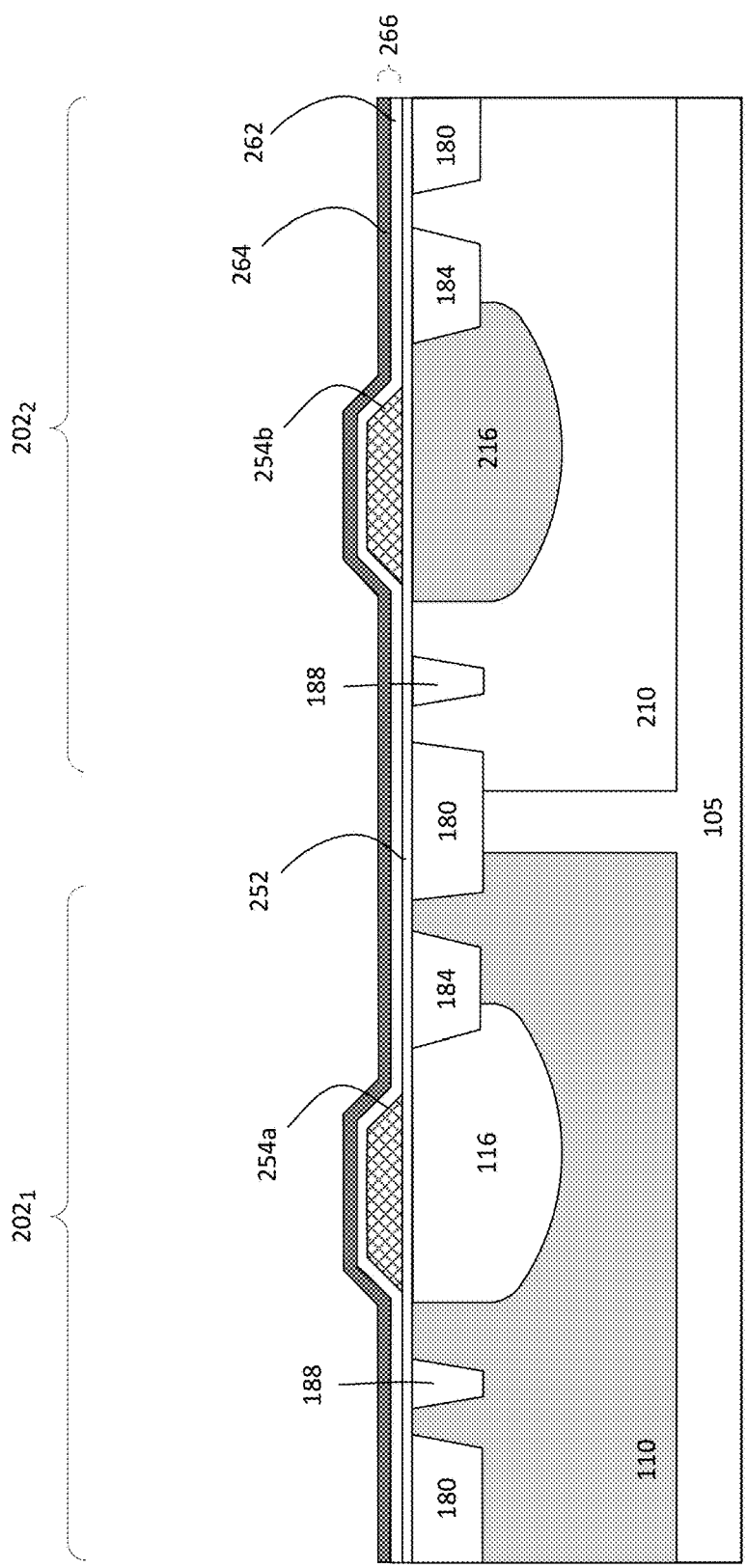

Referring to FIG. 2f, a dielectric stack 266 is conformally formed over the substrate 105. For example, the dielectric stack traverses the first and second HV device regions $202_1$ and $202_2$ to cover the exposed surfaces of the pad dielectric layer 252 and the polysilicon structures 254a and 254b. The dielectric stack 266, in one embodiment, is defined by a dielectric bilayer having a second dielectric layer 264 over a first dielectric layer 262. The first and second dielectric layers may be formed of different dielectric materials and different thicknesses. The dielectric stack includes, for example, a thicker nitride layer 264 over a thinner oxide layer 262. Other dielectric materials or configurations of the dielectric stack 266 may also be useful. Various techniques can be used to form the dielectric stack 266. In one embodiment, chemical vapor deposition (CVD) is employed. For example, a silicon oxide layer 262 is blanket deposited over the substrate in a first CVD process to line the exposed top surface of the pad oxide layer 252 and polysilicon structures 254a and 254b. Next, a second CVD process, blanket deposits a silicon nitride layer 264 over the oxide layer 262.

The nitride and oxide layers 264 and 262 may be formed with different dielectric thicknesses to define a thickness of the dielectric stack 266. For example, the thickness of the oxide layer 262 may be about 100 Å and the thickness of the nitride layer 263 may be about 600 Å. Other thickness configurations of the first and second dielectric layers may also be useful.

Figure 2G:
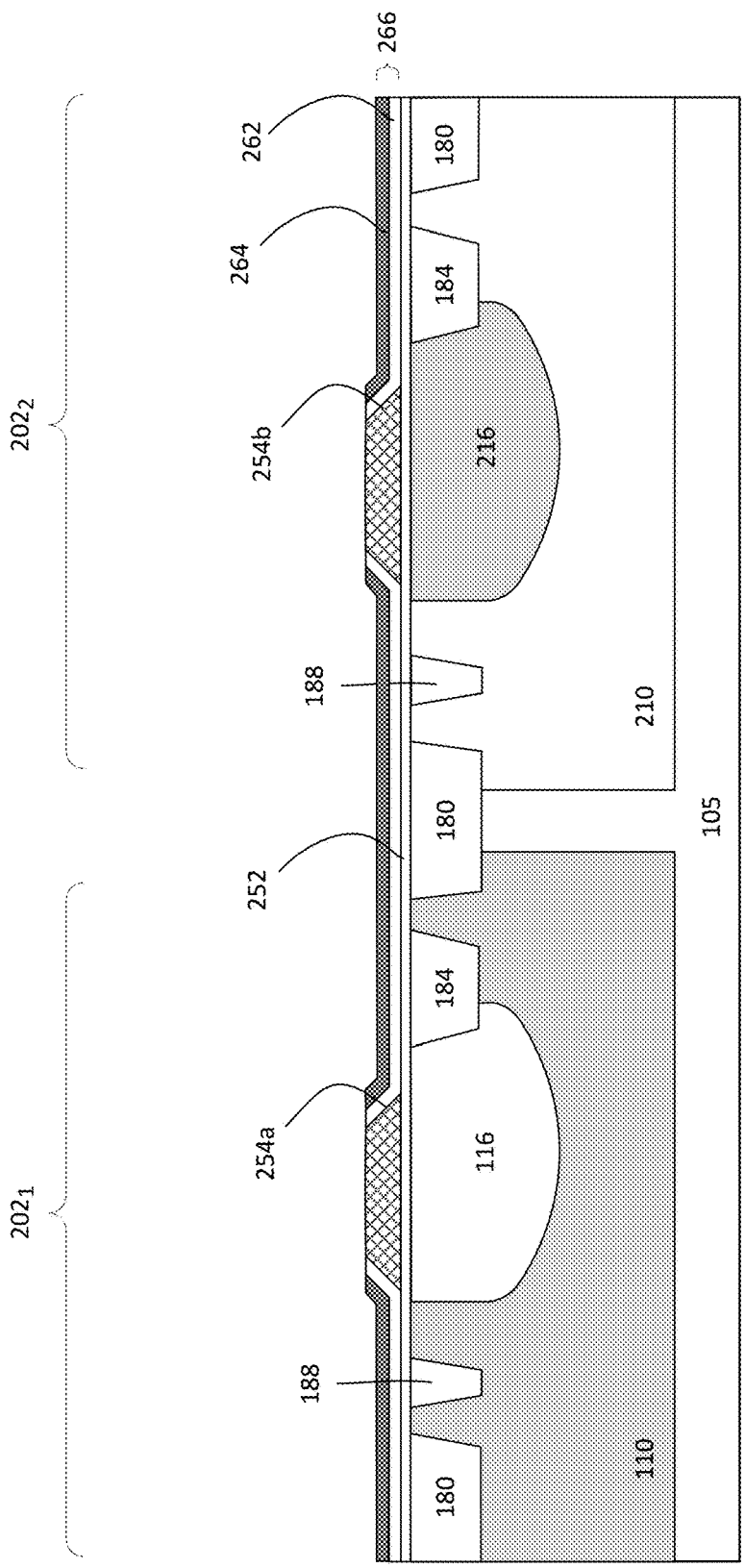

Referring to FIG. 2g, the dielectric stack 266 is processed to partially expose the underlying polysilicon structures 254a and 254b. For example, portions of the dielectric stack are removed to forms openings that expose the entire planar top surface of the polysilicon structures 254a and 254b. In one embodiment, processing the dielectric stack 266 includes performing a planarization process, such as chemical mechanical polishing (CMP), to remove portions of the nitride layer 264 overlapping the polysilicon structures 254a and 254b. The CMP process forms openings in the nitride layer 264 to expose topmost planar surface portions of the underlying oxide layer 262. The oxide layer 262, for example, serves as a polishing stop layer.

An etch process is performed to remove portions of the oxide layer 262 exposed by the openings in the nitride layer 264. The etch process, for example, removes exposed portions of the oxide layer 262 to expose the planar top surfaces of the polysilicon structures 254a and 254b. The etch process may include an etch chemistry which is highly selective to the bottom dielectric layer (e.g., oxide layer 262) of the dielectric stack 266 such that the underlying polysilicon surface is not recessed or damaged.

It is to be appreciated that the oxide layer 262 may also be slightly over-etched such that the topmost portions of the sloped sidewalls of the polysilicon structures 254a and 254b are exposed. This ensures that the planar topmost surface of the polysilicon structures 254a and 254b are completely exposed for an oxidizing process.

Figure 2H:
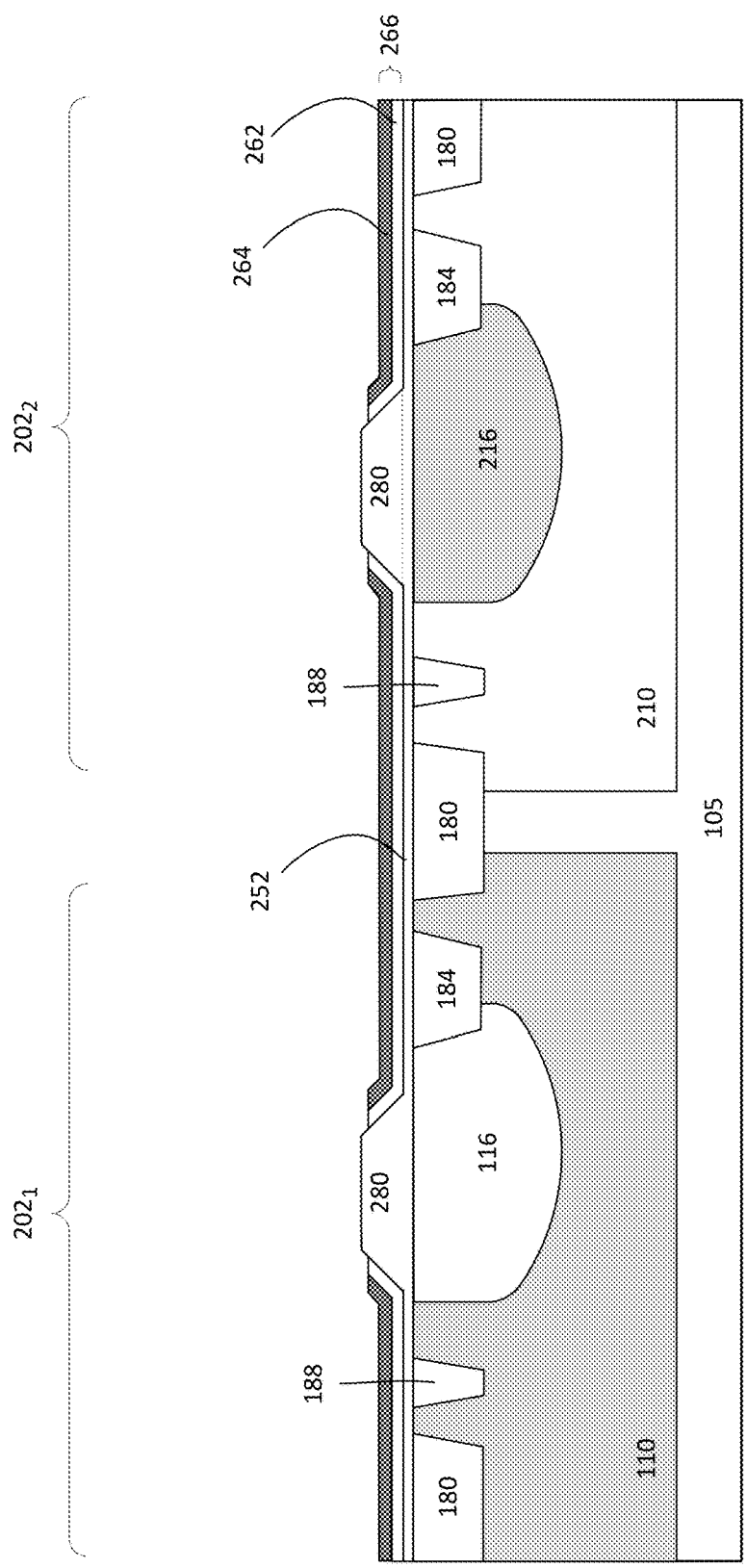

Referring to FIG. 2h, the polysilicon structures 254a and 254b are oxidized to form thick gate dielectric structures 280 over the first and second HV device regions $202_1$ and $202_2$. In one embodiment, the polysilicon structures 254a and 254b are completely oxidized by a furnace oxidation process. For example, the furnace oxidation process is employed to oxidize the polysilicon material exposed by the opening in the dielectric stack 266. The nitride layer 264, for example, serves as a selective mask against the oxidation process. The furnace oxidation process completely consumes the polysilicon material of the polysilicon structures 254a and 254b to form high quality silicon oxide (or furnace oxide) material. Other suitable oxidation processes may also be used to oxidize the polysilicon structures 254a and 254b.

It is appreciated that the growth of oxide material within the polysilicon structures may also result in an increase in physical thickness. For example, the resulting thick gate dielectric structures 280 may include higher planar top surfaces relative to the planar top surfaces of the polysilicon structures 254a and 254b due to an increase in thickness dimensions. The thick gate dielectric structures 280 include, for example, a thickness of about 1000-4000 Å. Other thickness dimensions may also be useful, depending on design requirements.

Figure 2I:
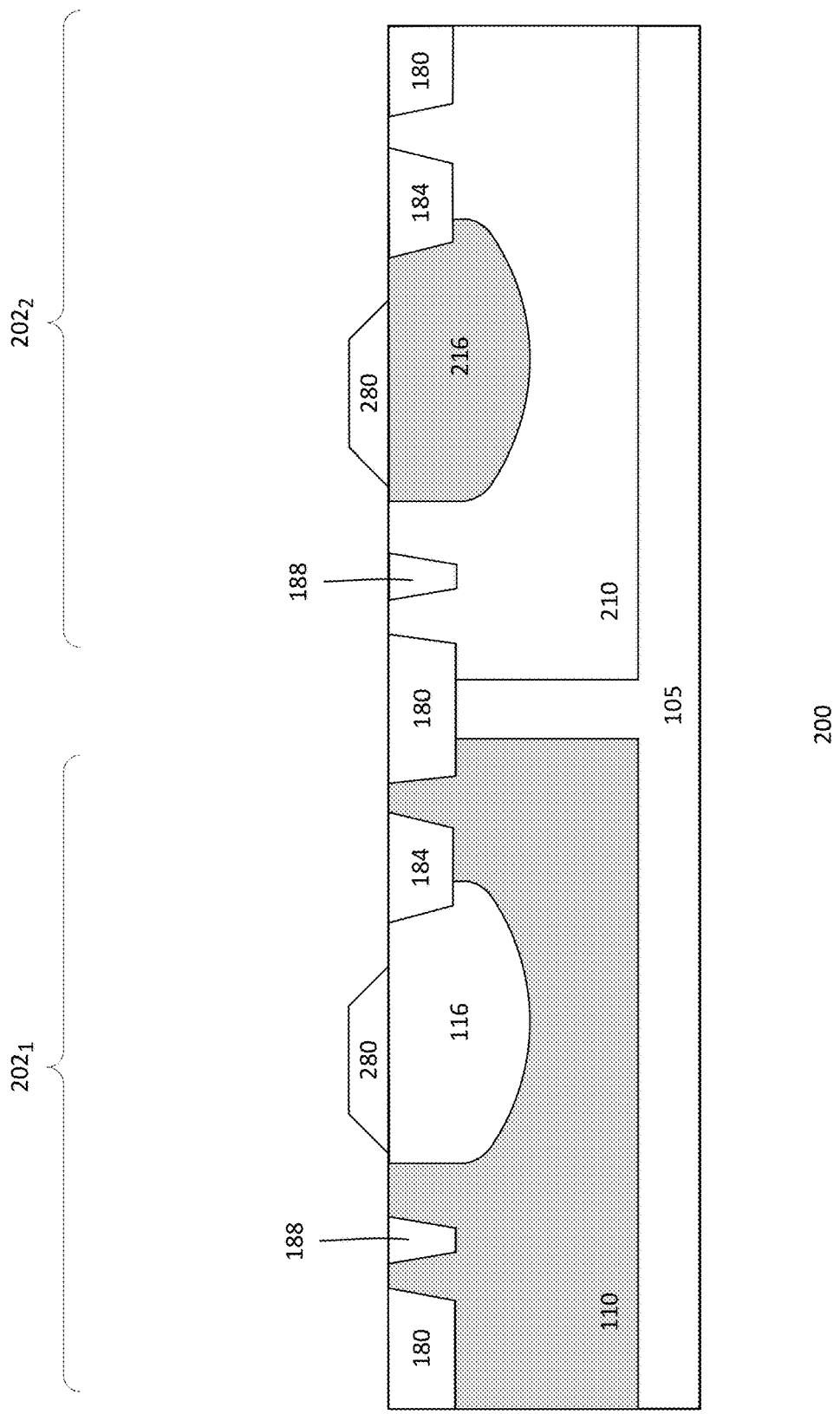

Referring to FIG. 2i, the substrate is processed to remove excess dielectric material. Various etching processes may be employed to completely remove the dielectric stack 266 and exposed portions of the pad oxide layer 252. For example, the etching processes may include highly selective etch chemistries to remove different dielectric materials. The selective etch process may include suitable process parameters to minimize removal of dielectric material from the thick gate dielectric structures 280. It is appreciated that portions of pad oxide layer 252 underlapping the thick gate dielectric structures 280 remains after the etch step to provide high quality dielectric interface between the thick gate dielectric structures 280 and the top surface of the substrate 105.

Figure 2J:
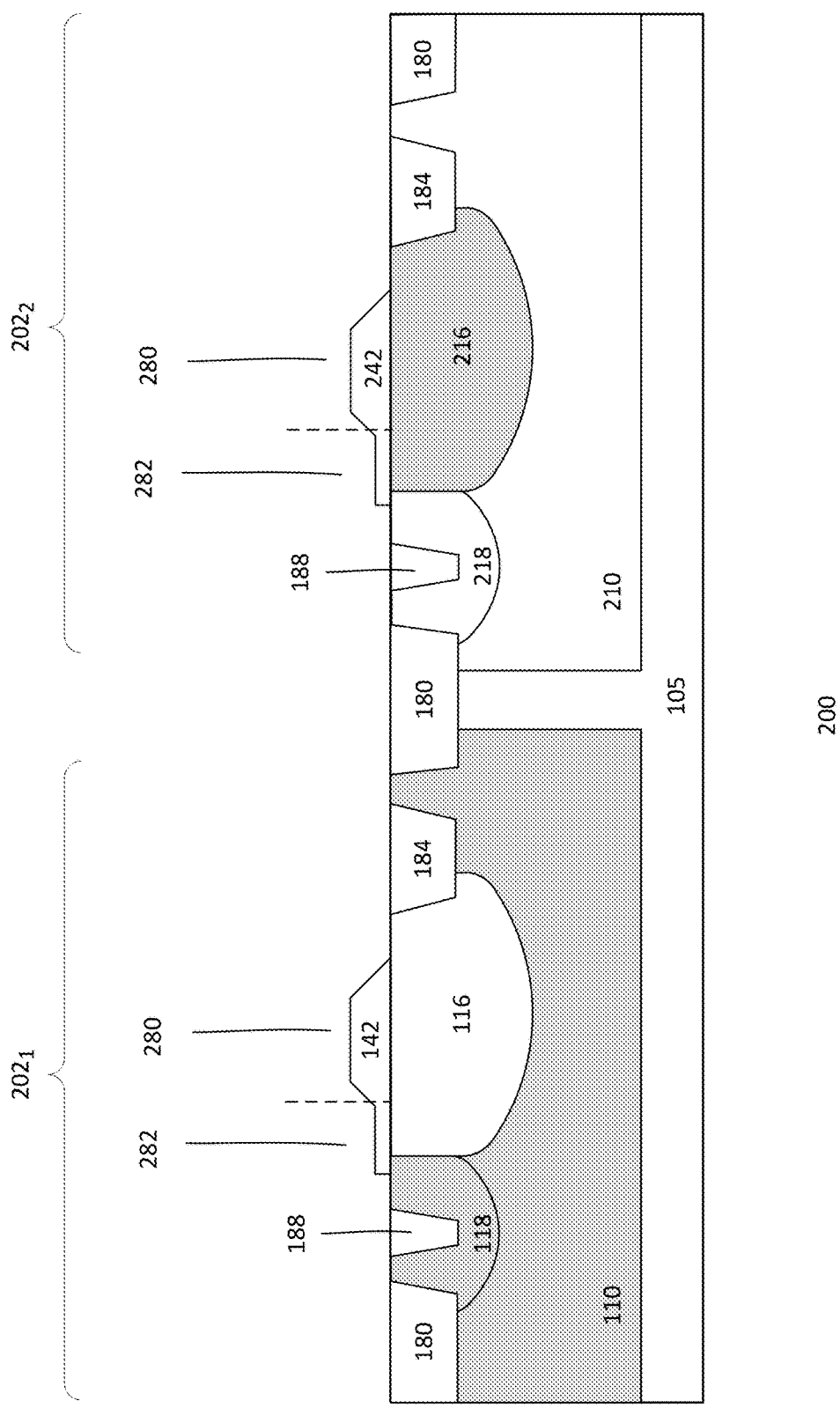

Referring to FIG. 2j, body wells 118 and 218 are formed within each of the device wells 110 and 210 in the first and second HV device regions $202_1$ and $202_2$. In one embodiment, the body well 118 is doped with p-type dopants for the n-type device well 116 and the body well 218 is doped with n-type dopants for the p-type device well 216. The body wells may be sequentially formed by ion implantation processes similar to that described in FIG. 2b. Other techniques may also be used to form the body wells. The ion implantation process to form each of the body wells may simultaneously form same polarity type wells having the same depth and dopant concentration as the body wells 118 and 218 in other device regions of the substrate 105.

In one embodiment, thin gate dielectrics 282 are formed over the substrate 105. The thin gate dielectrics 282 may be formed by a deposition process, such as CVD. For example, a blanket dielectric layer is conformally formed over the substrate. Alternatively, a dielectric layer may be grown by silicon oxidation techniques. The dielectric layer is then patterned to remove excess horizontal portions covering the substrate surface to form the resulting thin gate dielectrics 282. Removal of excess dielectric material can be achieved by, for example, an anisotropic etch, such as RIE. The thin gate dielectrics 282 abut each of the thick gate dielectrics 280 to form dual gate dielectric structures 142 and 242. For example, the thin gate dielectric 282 and the thick gate dielectric 280 are formed of the same dielectric material, such as silicon oxide. In one embodiment, the thin gate dielectric 282 includes a thickness same or similar to the gate dielectric of MV (medium voltage) or LV (low voltage) transistor gates formed in other device regions of the substrate 105. For example, forming gate dielectric of transistors in other regions of the substrate 105 also forms the thin gate dielectric 282.

Figure 2K:
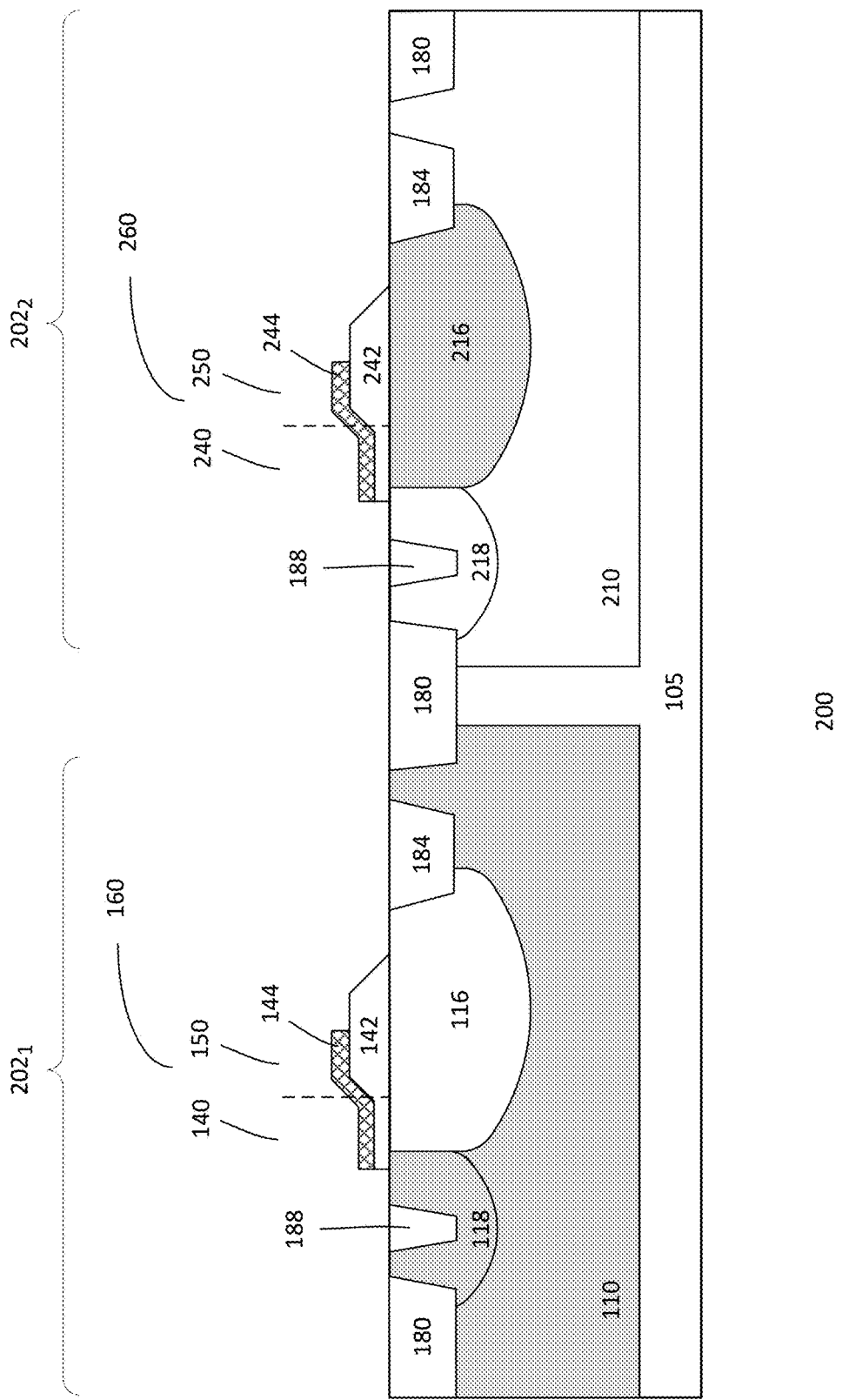
Figure 2I:
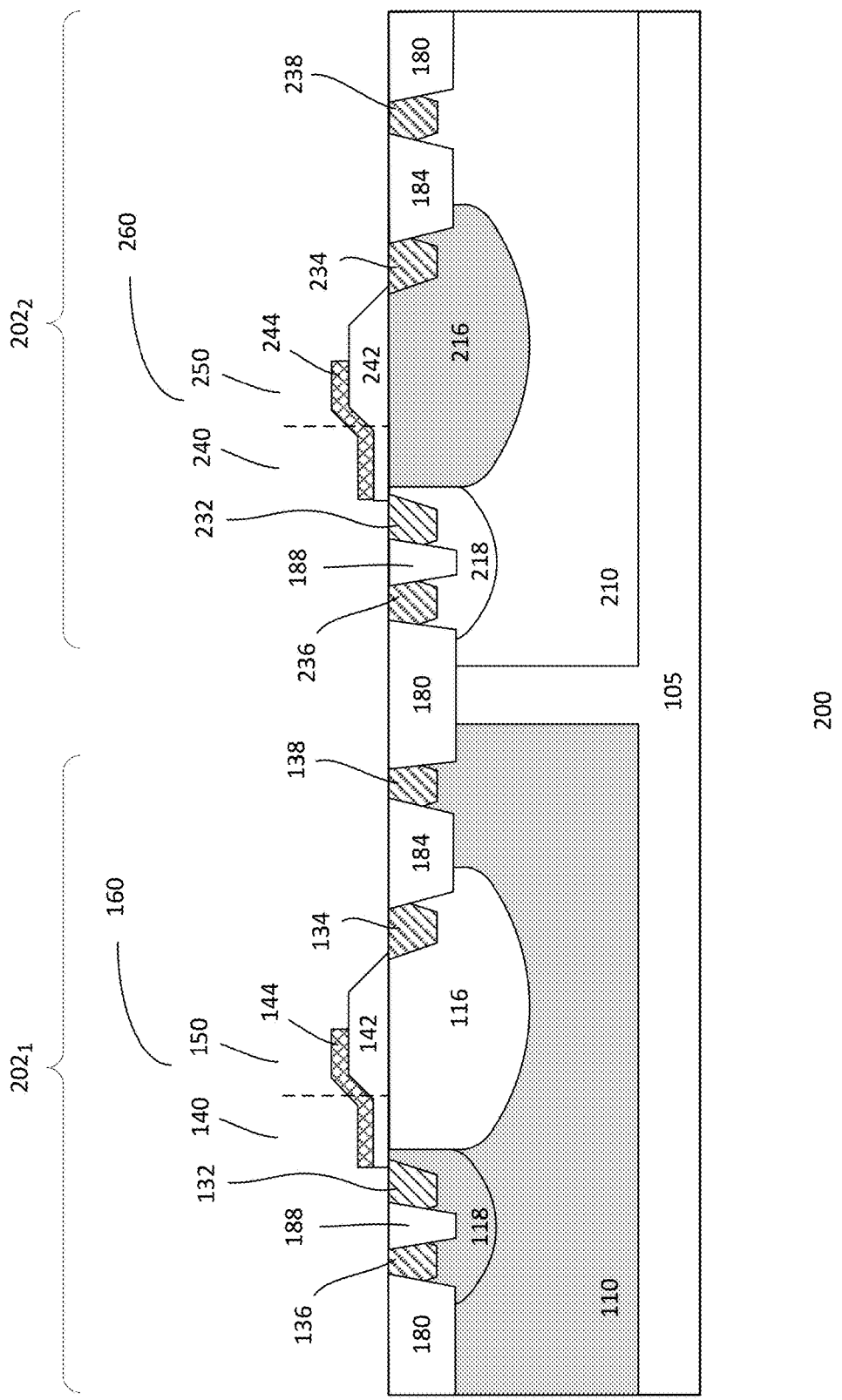

Referring to FIG. 2k, the process continues to form a gate electrode layer over the dual gate dielectric structures 142 and 242. The gate electrode layer, for example, may be a polysilicon layer. The polysilicon gate layer may be formed by, for example, CVD. The polysilicon layer may be doped with transistor type dopants to form a doped polysilicon to impart a higher conductivity to the gate electrode. Other materials and techniques may also be used to form the gate electrode layer. The gate electrode layer is patterned by mask and etch techniques to form gate electrodes 144 and 244. As shown, each of the gate electrodes 144 and 244 partially overlaps each of the dual gate dielectric structures 142 and 242 to form dual gate structures 160 and 260. For example, the portion of gate electrode overlapping the thin gate dielectric forms an active transistor gate 140 (or 240) and the portion of gate electrode partially overlapping the thick gate dielectric forms a gate field plate 150 (or 250).

Referring to FIG. 2l, heavily doped source and drain (S/D) regions 132, 134, 232 and 234 are formed in the substrate 105. The source and drain regions include first polarity type dopants for a first polarity type transistor or second polarity type dopants for a second polarity type transistor. For example, n-type S/D regions are formed in the first HV device region $202_1$ and p-type S/D regions are formed in the second HV device region $202_2$. The source and drain regions may be formed by ion implantation process similar to that described in FIG. 2b. For example, the implant process may employ a source/drain (S/D) implant mask (not shown) having openings which expose portions of the substrate where the source and drain regions are to be formed. The S/D implant mask may also be patterned to expose portions of the substrate where well taps 136, 138, 236 and 238 are to be formed. For example, S/D regions and well taps of the same polarity type may be simultaneously formed by the same implantation step. Suitable implant parameters may be used to form the S/D regions and well taps, depending on implant species and junction requirements.

It is to be understood that S/D extension regions (not shown) may be selectively formed before forming the transistor S/D regions. For example, the S/D regions may include lightly doped (LD) extension regions extending beyond the heavily doped S/D regions to underlap a portion of the dual gate dielectric structures 142 and 242. Forming the LD extension regions includes implanting first or second polarity type dopants into the substrate for a first or second polarity type transistor. The process may also form S/D extension regions of transistors in other device regions of the substrate 105.

The process may continue to form metal silicide contacts (not shown) and contacts or via plugs. Silicide contacts are appropriately formed on terminals or contact regions of transistors on the substrate 105. For example, silicide contacts are formed on HV transistor gates, S/D regions and body well taps. Front-end-of-line (FEOL) processing, for example, may be completed after silicide formation. The metal silicide contacts may be employed to reduce contact resistance and facilitate contact to the back-end-of-line (BEOL) metal interconnects.

A pre-metal dielectric (PMD) layer (not shown) is formed on the substrate covering the dual gate structures 160 and 260. The PMD layer serves as the first interlevel dielectric (ILD) layer of a device or IC in which contact plugs or vias are formed to couple to the various contact regions or terminals on the substrate 105. Additional ILD layers may be formed over the PMD layer to form a BEOL dielectric stack. The BEOL dielectric stack may include intra-metal dielectric (IMD) layers in which conductive lines or metal interconnects are formed. Additional processes may be performed to complete the IC. Such processes may include final passivation, dicing, packaging and testing.

The embodiment as described in FIGS. 2a-2l results in various advantages. As described, a sacrificial undoped polysilicon layer is patterned and subsequently oxidized to form the thick gate dielectric portion of the dual gate dielectric structures 142 and 242. Employing a dry etch process to pattern the sacrificial polysilicon layer avoids the need for a wet clean process, which is very difficult to control, thereby improving control and precision in forming the dual gate dielectric structures 142 and 242. Performing furnace oxidation process on the patterned sacrificial polysilicon layer forms thick gate dielectric structures with high quality oxide material to improve hot-carrier injection (HCI) reliability.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a high voltage device, comprising:
   providing a substrate;
   forming a plurality of isolation regions within the substrate, wherein the isolation regions comprise a device isolation region, and first and second internal isolation regions, wherein the device isolation region defines a high voltage device region of the substrate, and the first and second internal isolation regions are disposed in the high voltage device region;
   forming a device well in the high voltage device region, wherein the device well encompasses the high voltage device region;
   forming a drift region within the device well, wherein the drift region is positioned adjacent to the first internal isolation region and partially underlaps the first internal isolation region;
   forming a body well within the device well, wherein the body well is positioned adjacent to the drift region and surrounds the second internal isolation region;
   forming a dual gate structure on the substrate between the first and second internal isolation regions, wherein the dual gate structure comprises oxidized polysilicon material; and
   forming first and second source/drain regions adjacent to first and second sides of the dual gate structure, wherein the first source/drain region is disposed within the body well and the second source/drain region is disposed in the drift region.

2. The method of claim 1 wherein the first source/drain region is aligned to the first internal isolation structure, and the second source/drain region is aligned to the second internal isolation structure.

3. The method of claim 1 comprising:
   forming a first well tap within the device well; and
   forming a second well tap within the body well.

4. The method of claim 3 wherein the first well tap is disposed between the first internal isolation region and the device isolation region, and the second well tap is disposed between the second internal isolation region and the device isolation region.

5. The method of claim 1 wherein forming the device well and the body well comprise implanting p-type dopants, and forming the drift region comprises:
   implanting n-type dopants.

6. The method of claim 1 wherein the dual gate structure comprises a variable thickness gate dielectric defined by a thin gate dielectric abutting a thick gate dielectric, and the thick gate dielectric comprises the oxidized polysilicon material.

7. The method of claim 6 wherein the thick gate dielectric includes sloped sidewalls, and the sidewalls of the thick gate dielectric are angled about 45 degrees relative to a top surface of the substrate.

8. The method of claim 6 wherein forming the dual gate structure comprises:
   patterning a sacrificial polysilicon layer; and
   performing an oxidation process to oxidize the patterned sacrificial polysilicon layer.

9. The method of claim 6 wherein forming the dual gate structure comprises:
   forming a gate electrode on the variable thickness gate dielectric,
   wherein the gate electrode partially overlaps the thick gate dielectric.

10. The method of claim 9 wherein the second source/drain region is disposed adjacent to the thick gate dielectric.

11. A method for forming a high voltage transistor, comprising:
   providing a substrate;
   forming a device isolation region within the substrate, wherein the device isolation region surrounds a high voltage device region of the substrate;
   forming a device well in the high voltage device region, wherein the device well encompasses the high voltage device region;
   forming a drift region within the device well;
   forming a body well within the device well, wherein the body well is positioned adjacent to the drift region;
   forming a variable thickness gate dielectric on the substrate, wherein forming the variable thickness gate dielectric comprises patterning a sacrificial polysilicon layer and oxidizing the patterned sacrificial polysilicon layer to define a thick gate oxide of the variable thickness gate dielectric, wherein the thick gate oxide comprises sloped sidewalls;
   forming a gate electrode on the variable thickness gate dielectric, wherein the gate electrode partially overlaps the thick gate oxide; and
   forming first and second source/drain regions adjacent to first and second sides of the variable thickness gate dielectric, wherein the first source/drain region is disposed within the drift region and the second source/drain region is disposed in the body well of the high voltage device region.

12. The method of claim 11 comprising:
   forming first and second internal isolation regions within the device well,
   wherein the variable thickness gate dielectric is positioned between the first and second internal isolation regions.

13. The method of claim 12 wherein the first source/drain region is adjacent to the first internal isolation region, and the second source/drain region is adjacent to the second internal isolation region.

14. The method of claim 11 wherein the device well and the body well comprise same polarity type dopants, and the drift region comprises different polarity type dopants from the device well and body well.

15. The method of claim 11 wherein forming the variable thickness gate dielectric comprises:
   forming a thin gate dielectric abutting a sloped sidewall of the thick gate oxide.

16. The method of claim 15 wherein the gate electrode extends to cover an entire top surface of the thin gate dielectric, and the gate electrode comprises a uniform thickness throughout.

17. A method for forming a high voltage transistor, comprising:
   forming a device isolation region in a substrate that surrounds a high voltage device region within the substrate;
   forming a device well and a body well in the high voltage device region, wherein the device well encompasses the high voltage device region and the body well is disposed within the device well;
   forming a first internal isolation region in the body well;
   forming a first well tap within the body well;
   forming a drift region within the device well, wherein the drift region is positioned adjacent to the body well;
   forming a gate structure on the substrate over the high voltage device region, wherein the gate structure includes a gate electrode and a dual thickness gate dielectric, and the gate structure overlaps with the body well and the drift region;
   forming a first source/drain region in the body well adjacent to a first side of the gate structure; and
   forming a second source/drain region in the drift region adjacent to a second side of the gate structure,
   wherein the first internal isolation region is disposed in the body well between the first source/drain region and the first well tap.

18. The method of claim 17 wherein forming the gate structure comprises:
   forming a thick gate oxide having first and second sloped sidewalls
   wherein the thick gate oxide provides a first portion of the dual thickness gate dielectric.

19. The method of claim 18 wherein forming the gate structure further comprises:
   forming a thin gate dielectric abutting a sloped sidewall of the thick gate oxide,
   wherein the thin gate dielectric provides a second portion of the dual thickness gate dielectric, and the gate electrode layer covers a top surface of the thin gate dielectric and partially overlaps a planar topmost surface of the thick gate oxide.

20. The method of claim 17 wherein the first well tap is disposed between the first internal isolation region and the device isolation region, and further comprising:
   forming a second internal isolation region in the drift region; and
   forming a second well tap within the device well,
   wherein the second well tap is disposed between the second internal isolation region and the device isolation region.

* * * * *